(12) United States Patent
Khoo et al.

(10) Patent No.: US 10,943,856 B2
(45) Date of Patent: Mar. 9, 2021

(54) SYSTEM IN PACKAGE DEVICE INCLUDING INDUCTOR

(71) Applicant: Texas Instruments Incorporated, Dallas, TX (US)

(72) Inventors: Yien Sien Khoo, Melaka (MY); Siew Kee Lee, Kedah (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 16/460,665

(22) Filed: Jul. 2, 2019

(65) Prior Publication Data

US 2019/0326203 A1 Oct. 24, 2019

Related U.S. Application Data

(63) Continuation of application No. 15/693,059, filed on Aug. 31, 2017, now Pat. No. 10,340,210.

(Continued)

(51) Int. Cl.
*H01L 23/49* (2006.01)
*H01L 23/31* (2006.01)

(Continued)

(52) U.S. Cl.
CPC ... *H01L 23/49541* (2013.01); *H01F 1/14766* (2013.01); *H01F 1/36* (2013.01); *H01F 27/027* (2013.01); *H01F 27/255* (2013.01); *H01F 27/29* (2013.01); *H01F 27/292* (2013.01); *H01L 21/4825* (2013.01); *H01L 21/565* (2013.01); *H01L 23/3114* (2013.01); *H01L 23/495* (2013.01); *H01L 23/4952* (2013.01);

(Continued)

(58) Field of Classification Search
CPC .......... H01L 23/49541; H01L 23/3114; H01L 23/495; H01L 23/49513; H01L 23/4952; H01L 23/49537; H01L 28/10; H01F 1/14766; H01F 1/36; H01F 27/027; H01F 27/255; H01F 27/29; H01F 27/292
See application file for complete search history.

(56) References Cited

U.S. PATENT DOCUMENTS 8,017,410 B2  9/2011  Koduri
8,269,330 B1  9/2012  Lee et al.
(Continued)

*Primary Examiner* — Ida M Soward
(74) *Attorney, Agent, or Firm* — Dawn Jos; Charles A. Brill; Frank D. Cimino

(57) ABSTRACT

Described examples include a system in package (SIP) device, including: a first leadframe having a first surface and a second surface opposite the first surface; an integrated circuit die including solder bumps on a first surface and having a second opposite surface, the solder bumps mounted to the second surface of the first leadframe; a second leadframe having a first surface including a die pad portion, and a second opposite surface, the die pad portion attached to the second surface of the integrated circuit die; and an inductor mounted to the first surface of the first leadframe, the inductor having terminals with exterior portions electrically connected and mechanically connected to the first surface of the first leadframe, the inductor terminals spaced from one another by a portion of an inductor body, the portion of the inductor body between the inductor terminals spaced from the first surface of the first leadframe by a gap of at least 100 μms.

20 Claims, 11 Drawing Sheets

Related U.S. Application Data

(60) Provisional application No. 62/396,048, filed on Sep. 16, 2016.

(51) Int. Cl.

| | | |
|---|---|---|
| *H01F 1/14* | (2006.01) | |
| *H01F 1/36* | (2006.01) | |
| *H01L 23/495* | (2006.01) | |
| *H01F 27/02* | (2006.01) | |
| *H01F 27/29* | (2006.01) | |
| *H01L 21/48* | (2006.01) | |
| *H01L 49/02* | (2006.01) | |
| *H01L 21/56* | (2006.01) | |
| *H01F 27/255* | (2006.01) | |
| *H01F 1/147* | (2006.01) | |
| *H02M 3/158* | (2006.01) | |
| *H01L 23/64* | (2006.01) | |

(52) U.S. Cl.
CPC .. *H01L 23/49513* (2013.01); *H01L 23/49537* (2013.01); *H01L 28/10* (2013.01); *H01F 2027/295* (2013.01); *H01L 23/3107* (2013.01); *H01L 23/49575* (2013.01); *H01L 23/645* (2013.01); *H01L 2924/1206* (2013.01); *H01L 2924/19042* (2013.01); *H02M 3/158* (2013.01)

(56) References Cited

U.S. PATENT DOCUMENTS

| | | | |
|---|---|---|---|
| 9,082,532 B2* | 7/2015 | Itagaki | H01C 7/008 |
| 9,177,945 B2* | 11/2015 | Saye | H01L 23/49568 |
| 9,812,384 B2* | 11/2017 | Ostrowicki | H02M 3/00 |
| 9,842,797 B2* | 12/2017 | Carpenter | H01L 23/49524 |
| 2007/0096160 A1* | 5/2007 | Beroz | G06F 21/10 |
| | | | 257/232 |
| 2011/0089546 A1 | 4/2011 | Bayan | |
| 2012/0119343 A1* | 5/2012 | Bayan | H01L 21/4842 |
| | | | 257/676 |
| 2013/0221442 A1 | 8/2013 | Joshi | |
| 2013/0300505 A1* | 11/2013 | Kondo | H03F 1/0272 |
| | | | 330/255 |
| 2014/0063744 A1 | 3/2014 | Lopez et al. | |
| 2014/0070329 A1 | 3/2014 | Flores et al. | |
| 2015/0214198 A1 | 7/2015 | Lee et al. | |
| 2017/0053883 A1 | 2/2017 | How et al. | |
| 2017/0213781 A1* | 7/2017 | Lee | H01L 23/49537 |
| 2019/0088628 A1* | 3/2019 | Denison | H01L 25/07 |

\* cited by examiner

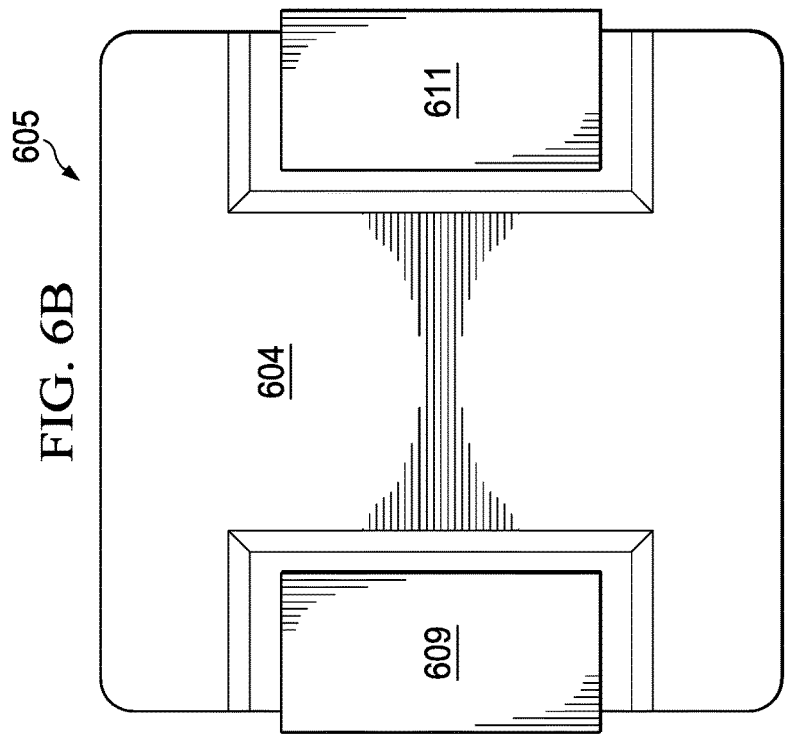
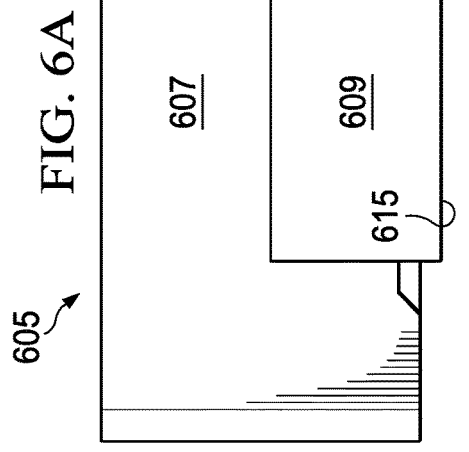
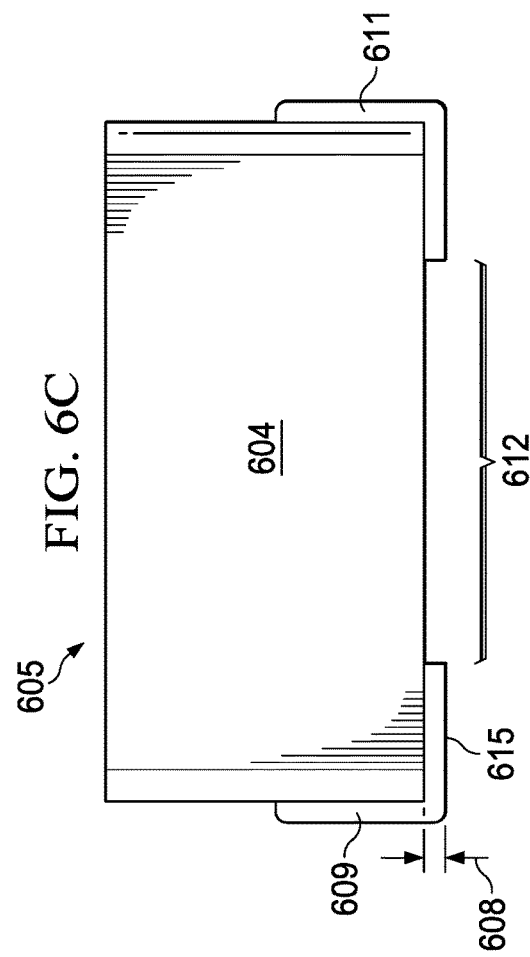

SYSTEM IN PACKAGE DEVICE INCLUDING INDUCTOR

CROSS-REFERENCE TO RELATED APPLICATIONS

This application is a continuation of U.S. patent application Ser. No. 15/693,059, filed Aug. 31, 2017, which claims the benefit of U.S. Provisional Application No. 62/396,048, filed Sep. 16, 2016, which is hereby fully incorporated herein by reference.

TECHNICAL FIELD

This disclosure relates in general to the field of semiconductor devices and processes, and more specifically to semiconductor devices in a system in package (SIP) device including an inductor.

BACKGROUND

For applications where an inductor is needed with a circuit coupled to the inductor, system-in-package (SIP) devices include an integrated circuit and the inductor in a single packaged device. Inductors used for SIP devices include ferrite body inductors with conductive terminals that provide electrical contact to the two terminals of the inductor. In some inductors the two terminals are arranged to form external connections on one side of the inductor to ease solder mounting onto pads on a circuit board or leadframe. In an SIP device, an integrated circuit is also mounted on the leadframe and the leadframe, inductor and integrated circuit are packaged together to form the SIP device.

However, when inductors in SIP devices are subjected to high voltage and high current, such as in a power application, damage to the inductor and to other devices in the SIP device can occur. The damage is caused by a resistive breakdown in the inductor body due to an electric field that forms between the body of the inductor and the leadframe, causing a damaging resistive breakdown in the inductor. Improvements are therefore desired in SIP devices incorporating inductors.

SUMMARY

In a described example, a system in package (SIP) device includes: a first leadframe having a first surface and a second surface opposite the first surface; an integrated circuit die including solder bumps on a first surface and having a second opposite surface, the solder bumps mounted to the second surface of the first leadframe; a second leadframe having a first surface including a die pad portion, and a second opposite surface, the die pad portion attached to the second surface of the integrated circuit die; and an inductor mounted to the first surface of the first leadframe, the inductor having terminals with exterior portions electrically connected and mechanically connected to the first surface of the first leadframe, the inductor terminals spaced from one another by a portion of an inductor body, the portion of the inductor body between the inductor terminals spaced from the first surface of the first leadframe by a gap of at least 100 μms.

BRIEF DESCRIPTION OF THE DRAWINGS

FIGS. 6A-6C are side, bottom and end views of an inductor for use in an arrangement.

DETAILED DESCRIPTION

Corresponding numerals and symbols in the different figures generally refer to corresponding parts unless otherwise indicated. The figures are not necessarily drawn to scale.

Figure 1:
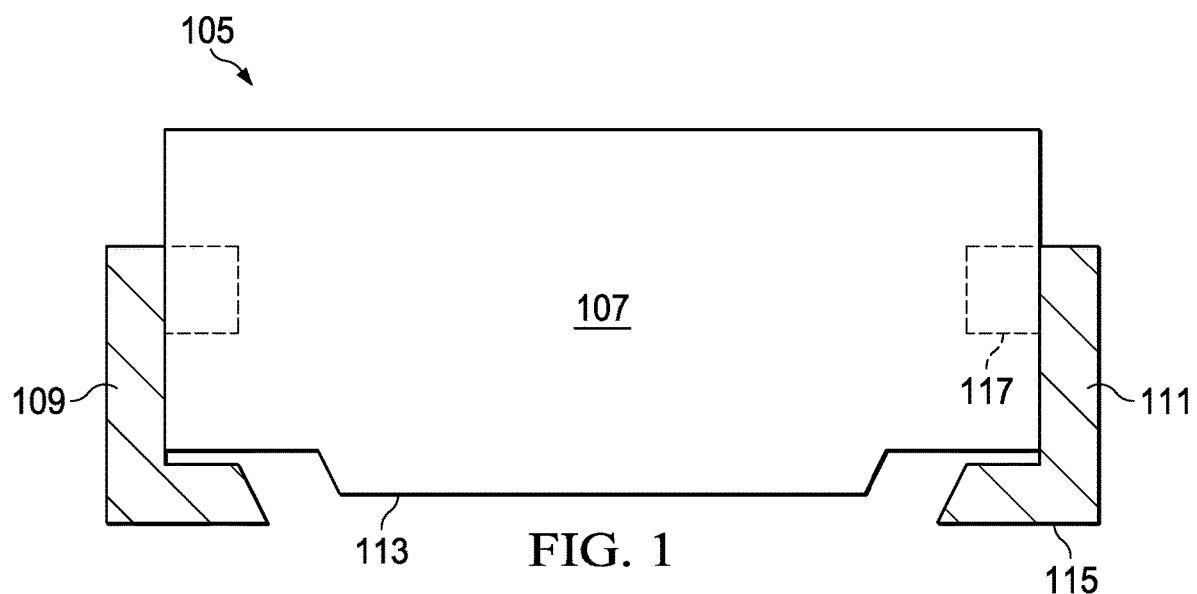
FIG. 1 is a cross section of an example two terminal inductor.

FIG. 1 is a cross section of an inductor 105. The inductor 105 is selected to have voltage and current handling capacity that is appropriate for an application. In a power application, for example, the inductor 105 may have to conduct tens of volts, such as from 30-50 volts, and several amperes of current, for example 10 amperes. Power applications include DC-to-DC converters such as buck and boost converters where an input voltage, such as a battery input voltage, is converted to a desired output voltage level less than (for buck or step-down converters) or greater than (for boost or step-up converters) the input voltage. In automotive applications a 12 Volt battery supply voltage can be stepped down to a voltage for use in supplying integrated circuits, such as 3.3 Volts or 5 Volts. Because the power converters require passive components including inductors, capacitor and resistors, along with an integrated circuit including field effect transistors (FETs) used as switches, the power converters can consume substantial board area. By packaging the passive components with the integrated circuit in a system in package (SIP) device, board area needed for the power converter is reduced. Other applications for SIP devices with inductors include RF and filtering applications.

The inductor 105 has a body 107, and two terminals 109, 111. The two terminals 109, 111 have surfaces that are exposed on one side of inductor 105 for surface mounting. In this example, the terminals 109 and 111 are extended from a central portion of the body 107 and formed around the body 107 to enable the inductor 105 to be surface mounted on a circuit board or to a leadframe. The terminals 109, 111 provide the electrical connections and a place for the physical attachment to the board or leadframe. The surface 115 of the terminal 111, for example, may be coated with a solderable coating such as nickel, palladium, gold or some combination of these materials to increase solderability. The body 107 of inductor 105 has a portion 113 located on the same side of the inductor 105 that the terminals 109, 111 are positioned on, and portion 113 lies between the two terminals, and this portion 113 extends to the plane of the lower surface of terminals 109, 111. Note that as shown in the dashed lines in portion 117, the terminals 111, 109 extend into the body 107 and contact coils formed within the body 107 of inductor 105 (not shown).

In one example, inductor 105 can be a ferrite body inductor. Example materials for the body 107 include a 99% (or higher) ferrite containing composition such as FeNi, FeSi, FeSiCr. In an example, the ferrite body inductor is made from a sintered powder with particle size of approximately 100 microns. While the ferrite body inductor is one example that is useful in the arrangements, the arrangements can be used with other inductor types that meet the size requirements for use in the SIP device and that have the required power handling capabilities for the application.

Figure 2:
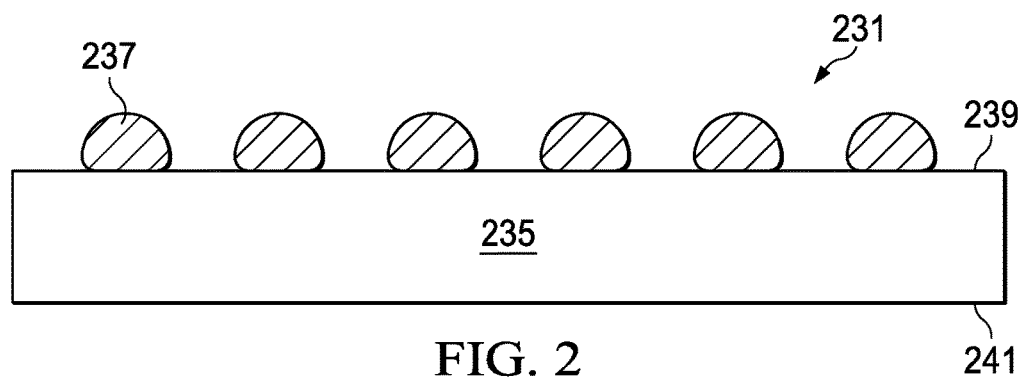
FIG. 2 is a cross section of an integrated circuit die with solder bumps.

FIG. 2 is a cross section of an example integrated circuit die 231. The integrated circuit die 231 has a substrate 235 and terminals with solder bumps or balls 237 on a first surface 239, and an opposing second surface 241. The integrated circuit 231 can include active devices formed in or on the substrate 235 such as FETs, controller circuitry, current sensing circuitry, voltage sensing circuitry, voltage reference generators and other circuitry. The integrated circuit die 231 is to be used in conjunction with the inductor of FIG. 1 to form a complete circuit. The integrated circuit die 231 is to be flip-chip mounted onto a leadframe using the solder bumps 237 with flux and a reflow process as described further hereinbelow. The solder reflow process forms solder connections to leads that electrically connect to the circuitry within the substrate 235. Substrate 235 can be a semiconductor substrate including silicon, gallium arsenide, gallium nitride, and germanium, and can include epitaxial layers such silicon germanium over an insulator.

Figure 3:
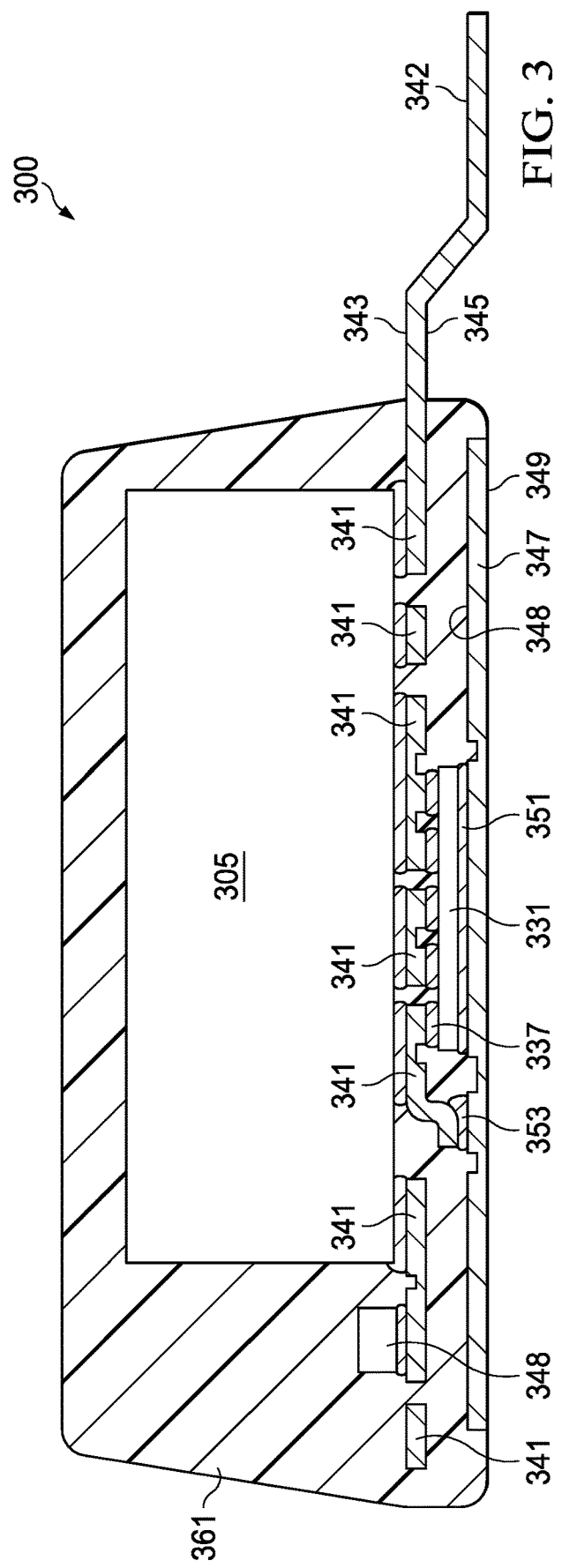
FIG. 3 is a cross section of a SIP device with a leadframe, inductor and an integrated circuit such as shown in FIGS. 1 and 2 assembled together.

FIG. 3 is a cross section for an SIP device 300 including an inductor 305, such as inductor 105 in FIG. 1, and an integrated circuit die 331, such as 231 in FIG. 2. Similar reference labels are used for similar elements in FIG. 3 that appear in FIGS. 1 and 2, for clarity of explanation. For example, inductor 305 in FIG. 3 corresponds to inductor 105 in FIG. 1. In FIG. 3, a first leadframe 341 is shown with a first surface 343, and a second opposing surface 345. As the elements are shown oriented in FIG. 3, this first leadframe 341 is an upper leadframe or top leadframe of SIP 300. The first surface 343 of the first leadframe 341 is configured for the attachment of passive elements such as 348, which can be a resistor or capacitor, and inductor 305. The passive elements are electrically connected to portions of leadframe 341 which includes pad portions for attaching the passive elements and lead portions (not visible in FIG. 3) for making connections between elements. A portion of first leadframe 341 that is labeled 342 extends laterally and forms external leads. The second surface 345 of the first leadframe 341 is configured for attaching integrated circuit die 331 using a flip-chip mounting by use of solder bumps or balls 337. By positioning the integrated circuit die 331 on pads (not visible in FIG. 3) of the second surface 345 of leadframe 341 and by then performing a solder reflow step, the solder balls 337 melt and form electrical connection and physical attachment of the integrated circuit die 331 to the second surface 345 of first leadframe 341. A second leadframe 347 positioned beneath the integrated circuit die 331 (as oriented in FIG. 3) has a die pad area on a first surface 348 for attaching integrated circuit die 331. Solder paste die attach material 351 provides a physical attachment between integrated circuit die 331 and the second leadframe 347 at a first surface 348. The second leadframe 347 has a second surface 349 opposite the first surface 348. In an example arrangement this second surface 349 can be exposed from the SIP package 300 and form an electrical or thermal connection point. In SIP 300, the first leadframe 341 and the second leadframe 347 are connected together at a pad 353 on the first surface 348 of leadframe 347. In SIP 300, the first leadframe also includes electrical connections between the passive components such as inductor 305 and the integrated circuit die 331 to form a complete circuit.

The integrated circuit die 331, the inductor 305, the first leadframe 341 and the second leadframe 347 are assembled together as is further described hereinbelow and then a molding step is used to cover portions of the assembly and form package body 361. This molding step is, in one example, a transfer molding process using a mold chase with open cavities for receiving the assemblies, and forcing heated thermoset mold compound into the cavities through runners and channels in a mold press. In another approach, resin or glob top molding compound can be used to cover the assembly to form SIP 300. A portion of the first leadframe 341 extends laterally through the finished package body 361 to form external leads 342 to allow connection to the devices on a circuit board or module. Portions or all of the second surface 349 of the second leadframe 347 are exposed. Electrical and/or thermal connections can be made to the exposed portions of surface 349.

In the SIP device of FIG. 3, the inductor 305 is shown with a portion of the inductor 305, the bottom surface of inductor 305 as oriented in FIG. 3, positioned adjacent the first surface 343 of leadframe 341. In testing SIP devices using the configuration of FIG. 3, failures occurred in inductors such as ferrite body inductors. In a bias high acceleration stress test (bias HAST or BHAST), failures resulted in visible burn marks in the inductor body. These failures occur when a low resistive path is formed where the inductor body contacts or intermittently contacts the first leadframe during the stress test. An electric field forms between the inductor body and the leadframe, and dielectric breakdown then leads to an instantaneous discharge, resulting in damage to the inductor body and melting in the molded package resin.

Possible solutions considered for these failures include coating the inductor with an additional insulating layer. This approach will add cost to the inductor and the finished SIP device. An alternative solution considered is to use an organic substrate instead of a conductive leadframe. In the organic substrate, only the terminals of the inductor would be contacted electrically and the remaining portion of the substrate would be coated with a solder mask so no electrical path can form between the inductor body and the leadframe. However, this solution also adds substantially to the cost of the SIP device.

In example arrangements, an inductor body is formed with a standoff distance from the inductor body to the exterior surface of external terminals. When the inductor is assembled with the other components, the portion of the inductor body closest to the first leadframe is spaced from the other components in the SIP device and specifically the inductor body is spaced from the surface of the first leadframe by a minimum gap. Electric field formation is inversely proportional to the distance, the electric field is given by $E=V/L$, where L is the length of the path. Thus by providing a sufficient gap, the electric field will not form under the bias used in the bias HAST stress test, and the failures can be prevented.

Figure 4:
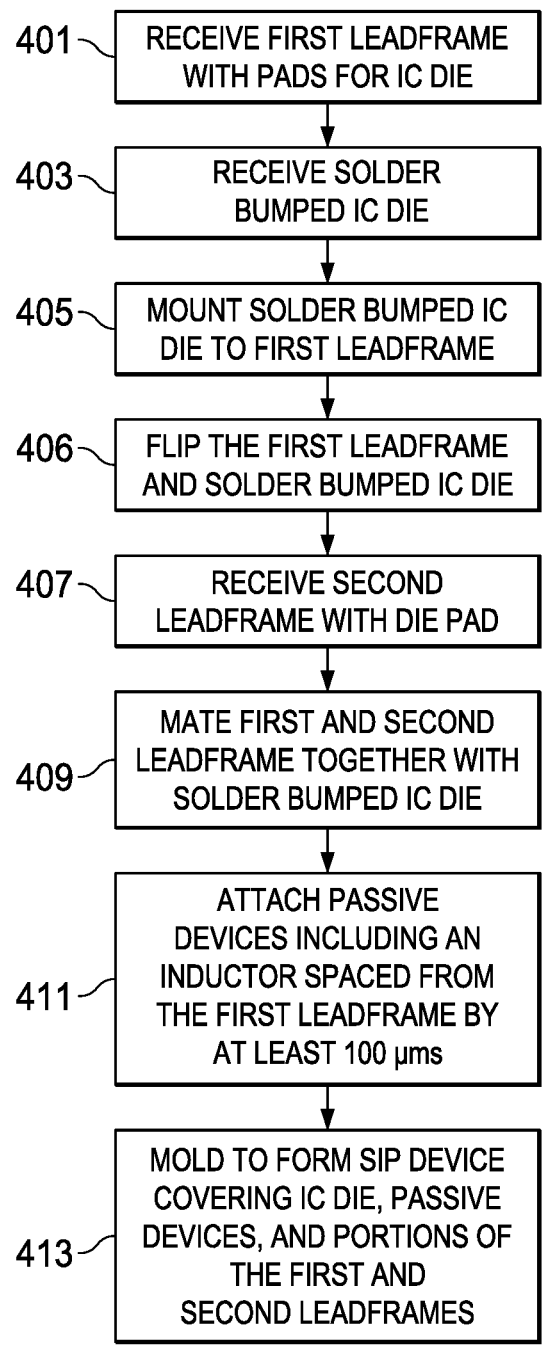
FIG. 4 is a flowchart of a method for assembling an SIP device arrangement.

FIG. 4 is a flowchart for a method for assembling an example SIP device of the arrangements. In FIG. 4, at step 401, the first leadframe is received. The first leadframe is patterned including pads for the solder bumps on a second surface, to receive the integrated circuit. The first leadframe can be copper, copper alloy or other leadframe materials such as Alloy 42, and can be coated overall (or in selected areas) for solder mount with plating materials that enhance solderability. An oxide coating can be formed on the first leadframe. Useful coatings for solderability include electroplated and electroless coatings such as gold, nickel, palladium, and combination coatings such as electroless nickel immersion gold (ENIG) and electroless nickel, electroless palladium, and immersion gold (ENEPIG).

At step 403 in FIG. 4, the solder bumped integrated circuit die is received. The solder bumps are on a first surface of the integrated circuit die. The integrated circuit die can implement any function that requires use of the passive components including the inductor to form a complete circuit. In an example SIP device of the arrangements, power circuits, filters, and RF circuits can be implemented by combining a driver IC or a controller IC with an inductor and other passive components. The integrated circuit die has a second surface opposite the first surface.

At step 405 in FIG. 4, the first surface of the solder bumped IC is flip chip mounted to the second surface of the first leadframe. Flux is used with a reflow step to cause the solder bumps to melt and reflow onto the pads of the leadframe and make an electrical contact and to make physical connections between the solder bumps on the IC die and the leadframe. The first surface of the solder bumped IC die is assembled facing the second surface of the first leadframe, and the IC die is flip chip mounted to the first leadframe. In an example method, the solder bumps are first dipped in a flux, then positioned on the first leadframe. A reflow step bonds the solder bumps to the leadframe. A deflux or clean step then removes excess flux.

At step 406, the first leadframe and the IC die, now physically attached to the first leadframe, are flipped.

At step 407, the second leadframe is received. The second leadframe has a die pad portion for mounting the integrated circuit die on a first surface. The die pad portion of the second leadframe is positioned proximate to the second surface of the integrated circuit die. Solder paste is disposed on the die pad portion of the second leadframe.

At step 409, the first surface of the second leadframe is mated to the assembly of the first leadframe and the integrated circuit die. The integrated circuit die is adhered to the die pad of the second leadframe by solder paste die attach, or by another die attach material. In some examples, the first leadframe may have one or more conductive leads arranged to make an electrical connection to the first surface of the second leadframe, so that the two leadframes are electrically connected. Solder paste is then used to make the connection between the lead of the first leadframe and the second leadframe. In an example this connection may be a ground connection. A second reflow step attaches the integrated circuit die to the second leadframe using the solder paste. A second deflux or clean step follows the reflow step.

At step 411, the assembly of the first leadframe, the second leadframe, and the integrated circuit die, now sandwiched between the second surface of the first leadframe and the first surface of the second leadframe, is provided. Passive devices, including an inductor, are mounted to the first surface of the first leadframe. Solder paste is dispensed on portions of the first surface of the first leadframe. Once the passive devices are placed on the first leadframe, a third reflow step is performed to bond the passive devices to the first leadframe. A third deflux or clean step follows the reflow step.

The inductor has at least two terminals that are mounted on the first surface of the first leadframe. Electrical connection is made using solder paste. The portion of the body of the inductor that lies on the same side of the inductor as the two terminals and between these two terminals is spaced from the closest portion of the first leadframe by a gap of at least 100 μms. In an example, the gap is 140 μms. Larger gaps can be useful depending on the voltage and current that the inductor will carry. The gap in another example is between 100 μms and 200 μms. The electric field is proportional to the voltage, and inversely proportional to the distance, so that as the voltage expected in an inductor in an application increases, the gap should be increased to compensate.

At step 413, the assembly now including the inductor and possibly including passives such as capacitors and resistors needed for the SIP device circuit mounted to the first surface of the first leadframe, the integrated circuit die that is flip chip mounted to the second surface of the first leadframe and physically mounted on the first surface of the second leadframe, is covered by a mold compound in a molding process. In an example, a transfer molding process uses a mold chase with a cavity sized to receive the assembly and to form a body around the assembly. A portion of the first leadframe extends from the mold cavity to form external leads for the finished SIP device. This portion of the first leadframe is not covered in the molding process. A thermoset molding compound, such as an epoxy resin, is heated to a liquid state and once melted is forced by mechanical pressure through runners and into the mold chase. The liquid mold compound surrounds the assembly and extends into the gap between the body of the inductor and the first leadframe, adding stability in the assembly by securing the first leadframe. Once the mold compound cools and hardens, it forms a plastic package encapsulating all of the elements of the assembly. Following molding, the external leads of the first leadframe are trimmed and formed to form separate electrical terminals for making electrical connection to the circuit in the SIP device.

In FIG. 4, one example method is presented starting with the first leadframe. In an alternative method arrangement, the method can begin with receiving the second leadframe, and the order of steps can be modified to form the assembly up to the molding step.

Figure 5A:
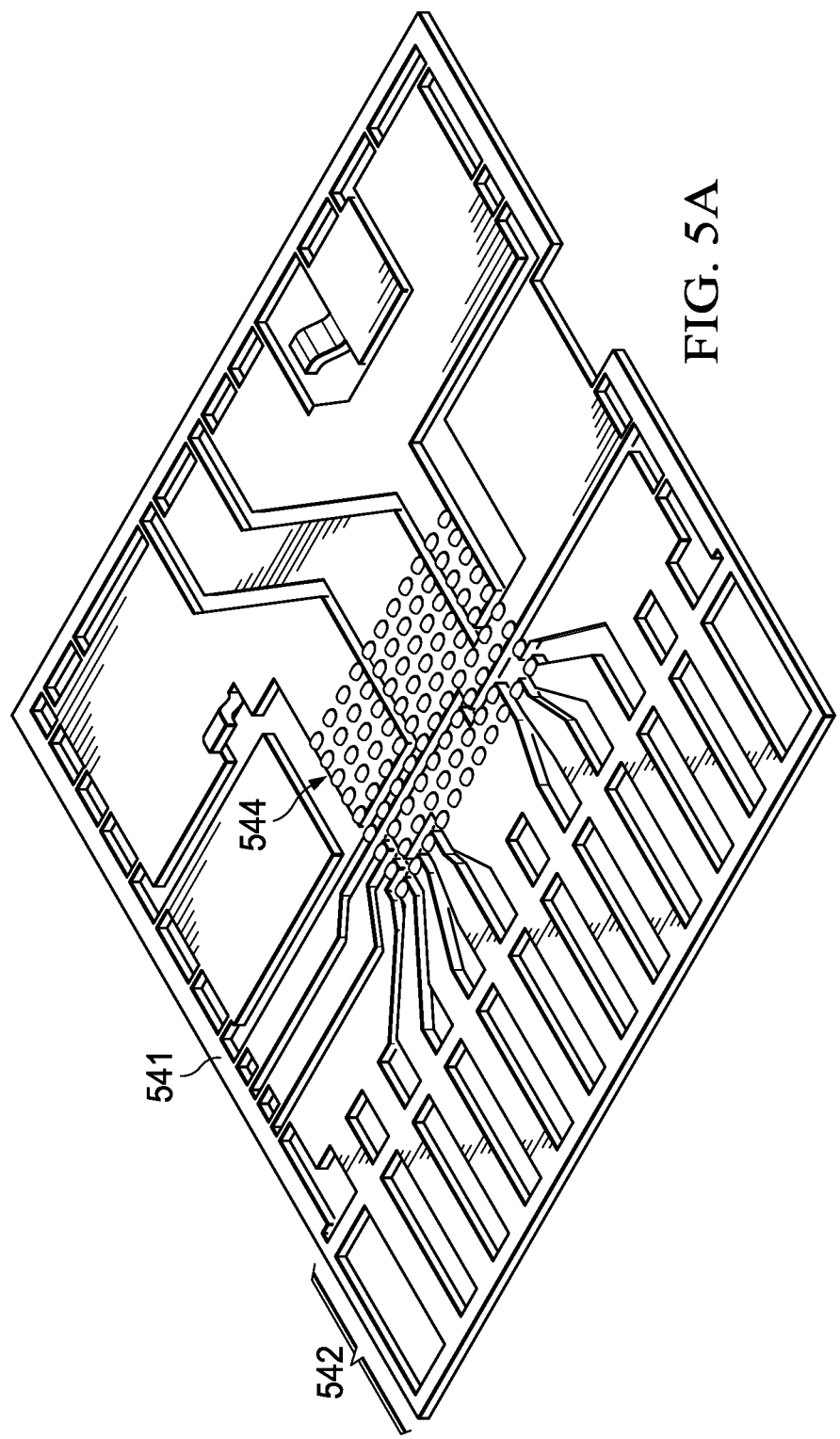
FIGS. 5A-5F are a series of projection views illustrating the method of FIG. 4.

FIGS. 5A-5F presents a series of projection views illustrating the method arrangement of FIG. 4. In FIG. 5A, the step 401, receiving the first leadframe, is shown by a projection view of the first leadframe, 541. Note that in FIGS. 5A-5F similar reference labels are used to those in FIG. 3, for clarity of explanation. For example, leadframe 541 corresponds to leadframe 341 in FIG. 3. In FIG. 5A, a portion of the leadframe 541, labeled 542, forms leads that will eventually form the electrical terminals to the completed SIP device. A central portion of leadframe 541, labeled 544, has pads that are configured to receive the solder bumps on an integrated circuit die. Note that the surface of leadframe 541 that is visible in the projection of FIG. 5A is the second surface, the surface for receiving the integrated circuit die solder bumps, as described hereinabove.

Figure 5B:
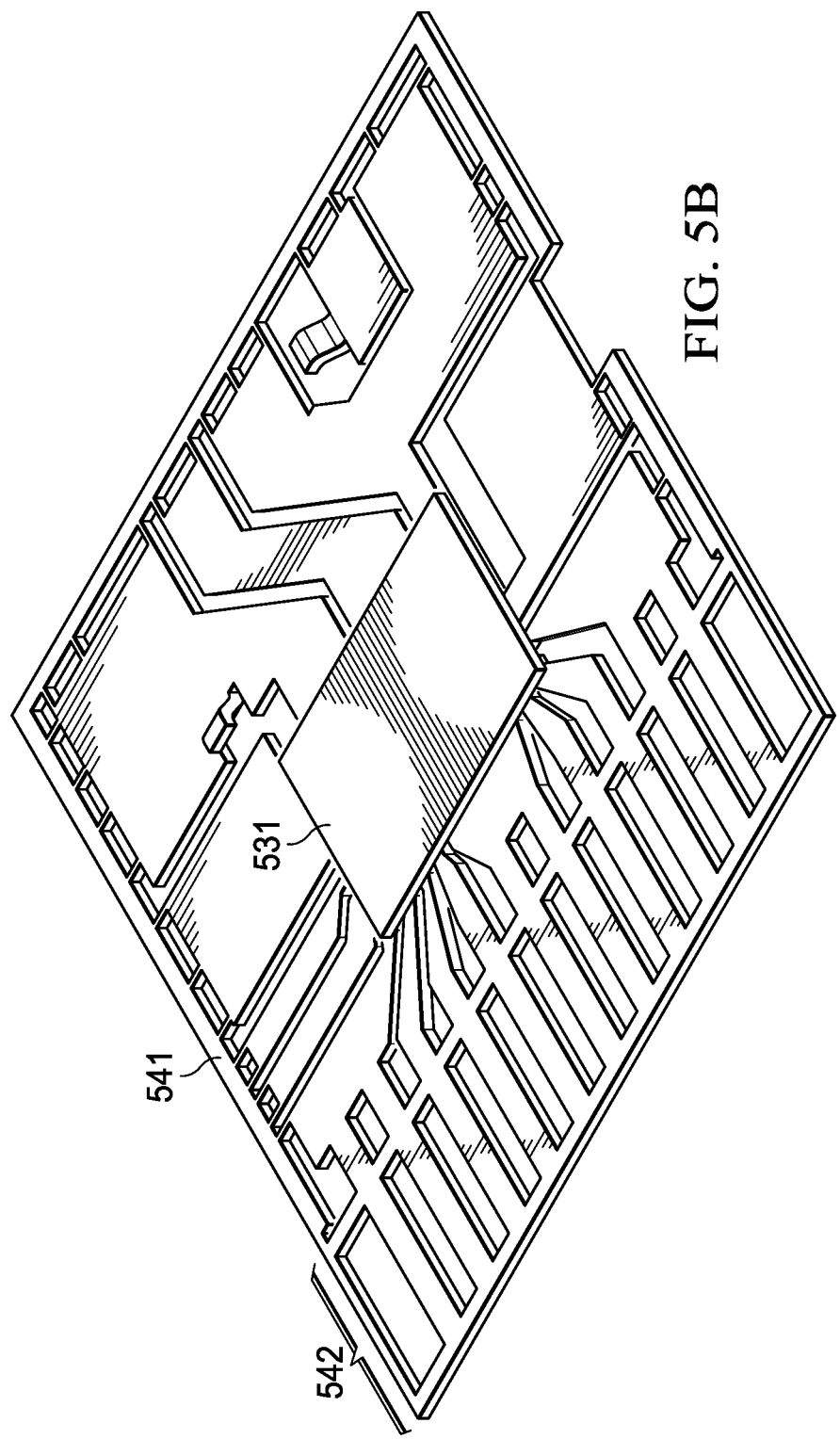

In FIG. 5B, a projection view illustrates the results of steps 403, 405 in FIG. 4. An integrated circuit die 531 is shown flip chip mounted (the solder bumps on the integrated circuit die are face down in FIG. 5B and not visible) to leadframe 541 in a portion of the leadframe with pads for attaching the solder bumps. Leads 542 are shown still connected to one another for mechanical support. The second surface of the integrated circuit die 531 is visible facing upwards in the orientation of FIG. 5B.

Figure 5C:
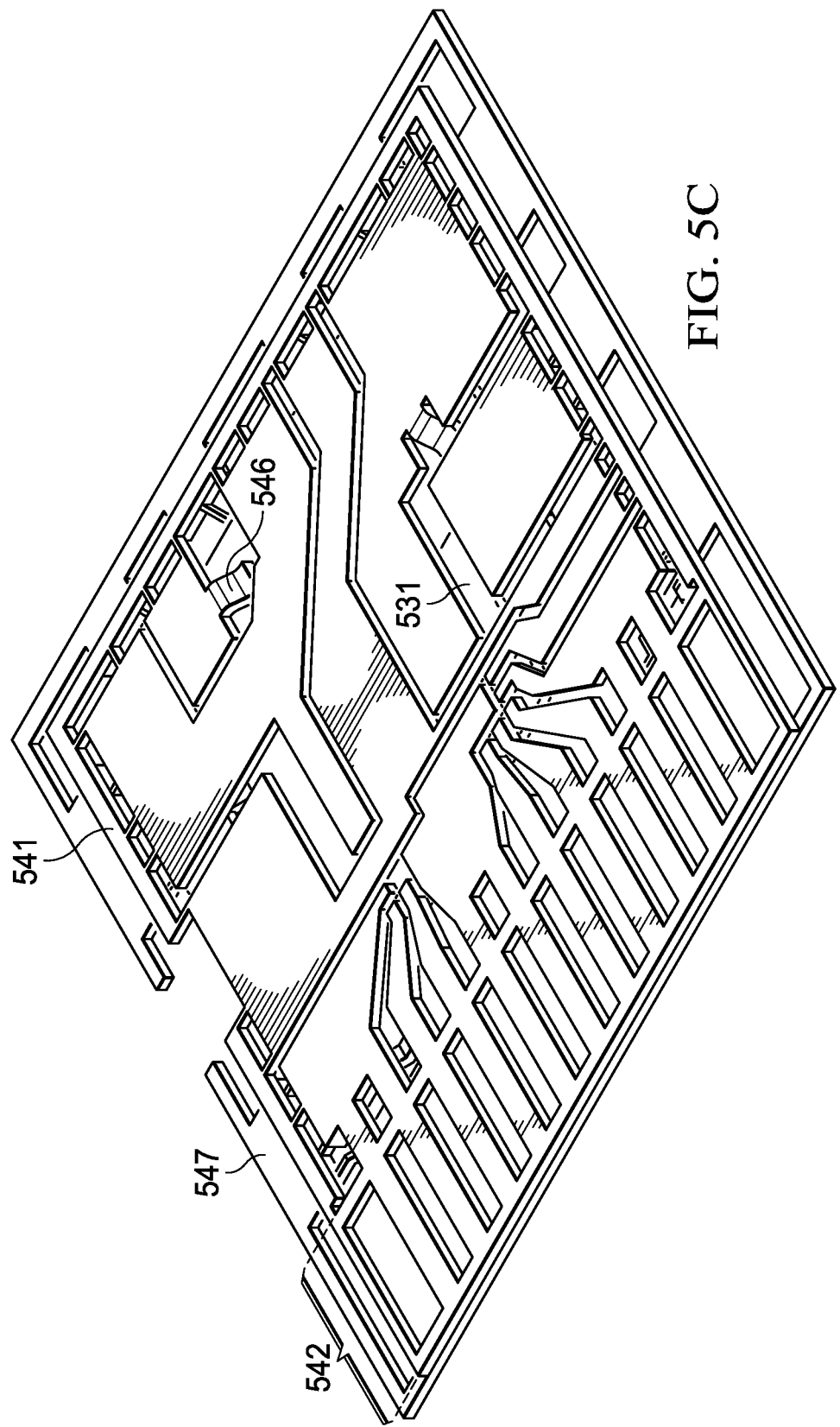

In FIG. 5C a projection view shows the results of steps 405, 406, and 407 in the method of FIG. 4. In step 406 in FIG. 4, the first leadframe and the integrated circuit die 531 are flipped so that the first surface of the first leadframe 541 is facing upwards. As shown in FIG. 5C, a second leadframe 547 (that corresponds to leadframe 347 in FIG. 3) is shown assembled with integrated circuit die 531 on a die pad of the first surface of the second leadframe 547, (the integrated circuit die is now oriented face up when compared to FIG. 5B), and the first leadframe 541 is shown overlying second leadframe 547. In the orientation of FIG. 5C, the second surface of the first leadframe 541 is at the top of the assembly. The first leadframe 541 has a lead labeled 546 in FIG. 5C that is mechanically and electrically connected to the first surface of the second leadframe 547.

Figure 5D:
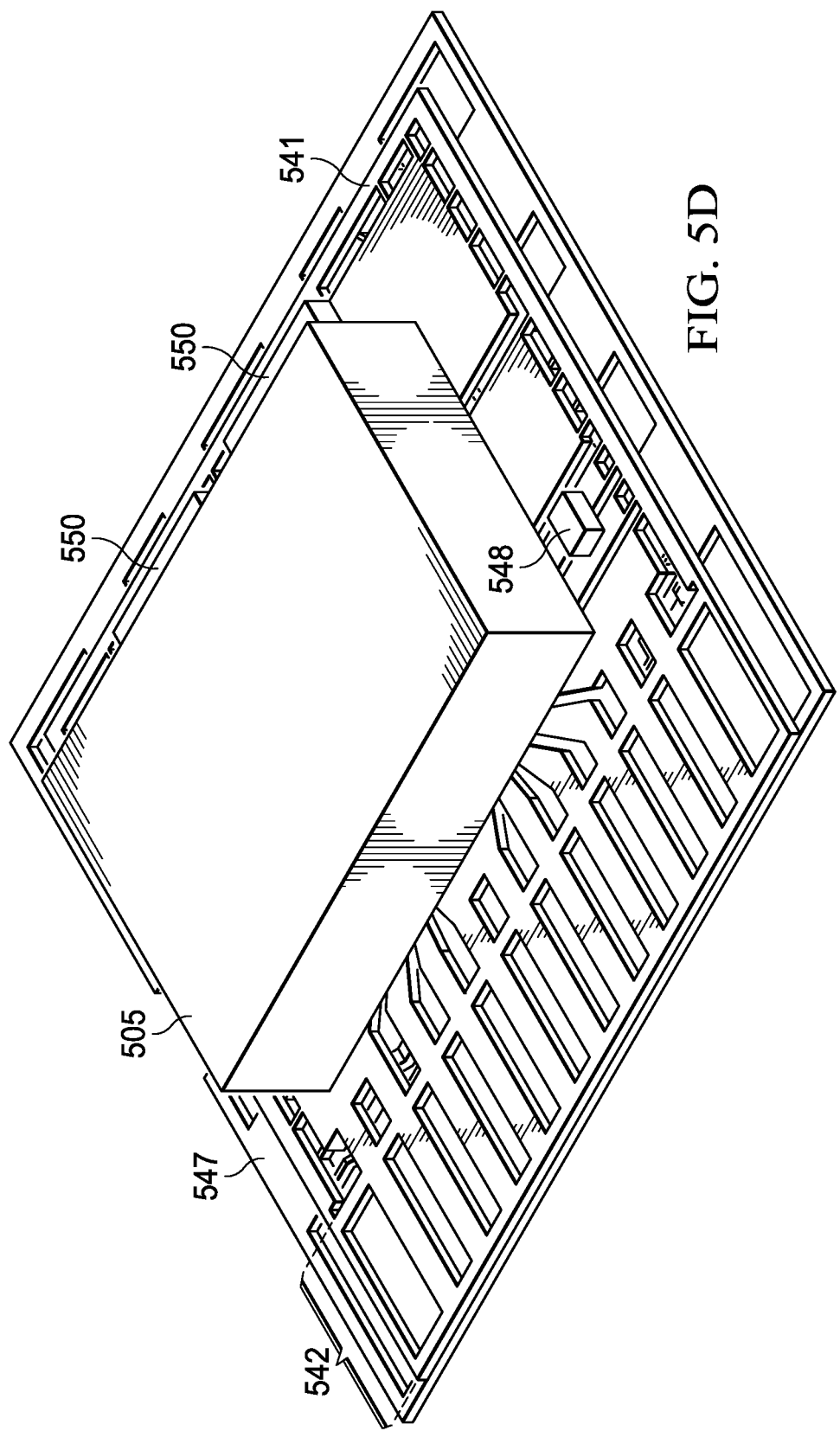

FIG. 5D is a projection view showing the assembly of FIG. 5C following the step 411 of the method of FIG. 4. In FIG. 5D, the first leadframe 541, the second leadframe 547, and the passive devices including the inductor 505 (corresponding to 305 in FIG. 3), a passive 548 (corresponding to passive 348 in FIG. 3) and two additional passive components 550 are shown after assembly. The passives are surface mounted to the first surface of the first leadframe using solder paste, for example, between conductive terminals on the passive components and to conductive pads on the first surface of the first leadframe. In FIG. 5D, the passive 548 may be a resistor, and the passives 550 can be capacitors, while the inductor 505 is the largest volume component in the assembly. The integrated circuit die is not visible in the view of FIG. 5D but lies beneath the inductor 505.

Figure 5E:
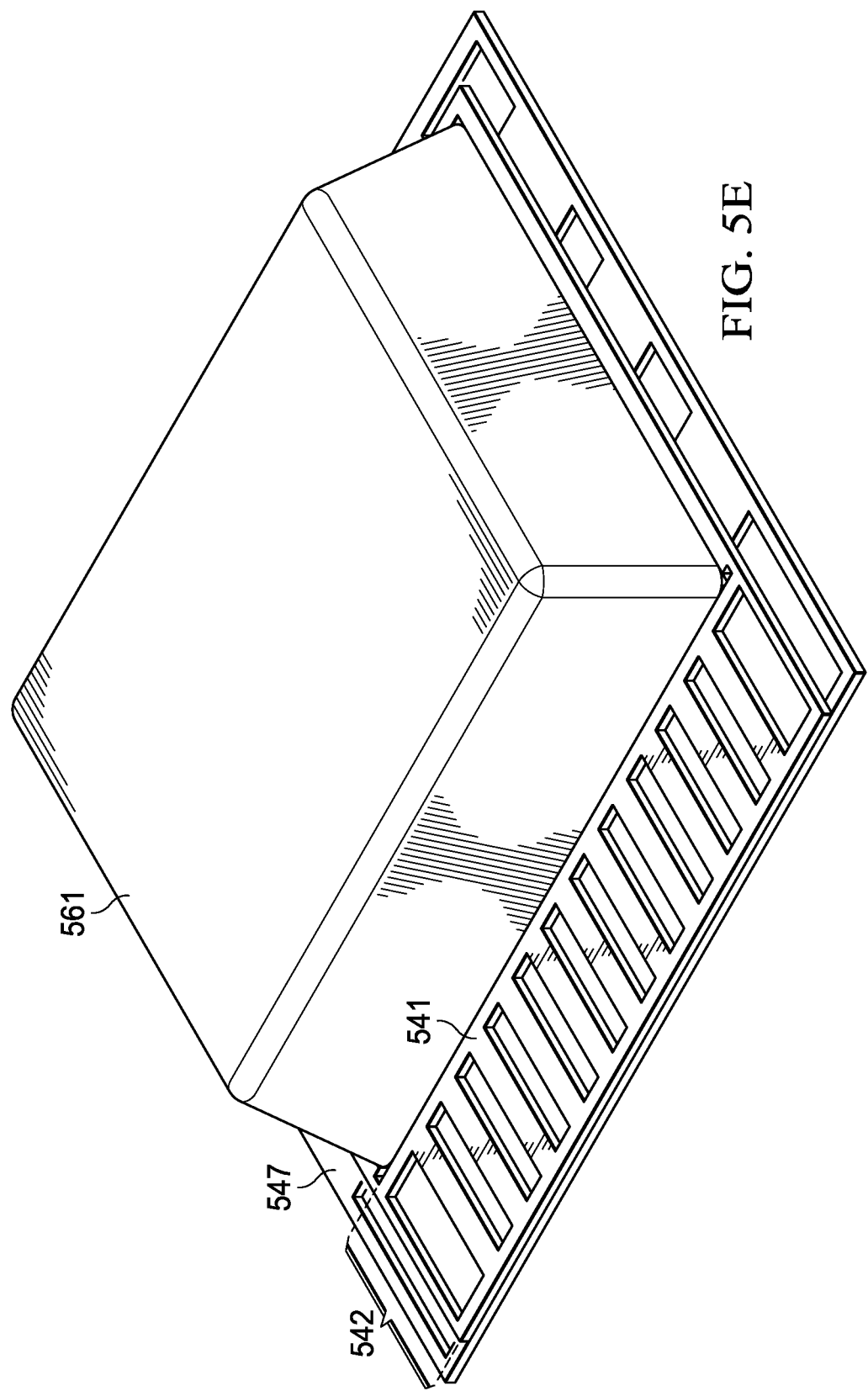

FIG. 5E is a projection view showing the SIP device after step 413 of FIG. 4 is complete. In FIG. 5E, the first leadframe 541, with leads 542, the second leadframe 547 and the package body 561 are shown after the molding process. The body 561 covers the integrated circuit die, the inductor, the passive components, and forms the SIP packaged device. The package is an epoxy resin in one example. In other examples, glob top or other packaging materials for semiconductor integrated circuits are used. Leads 542 are still connected to each other by portions of the first leadframe 541 for mechanical support after the molding step, as shown in FIG. 5E.

Figure 5F:
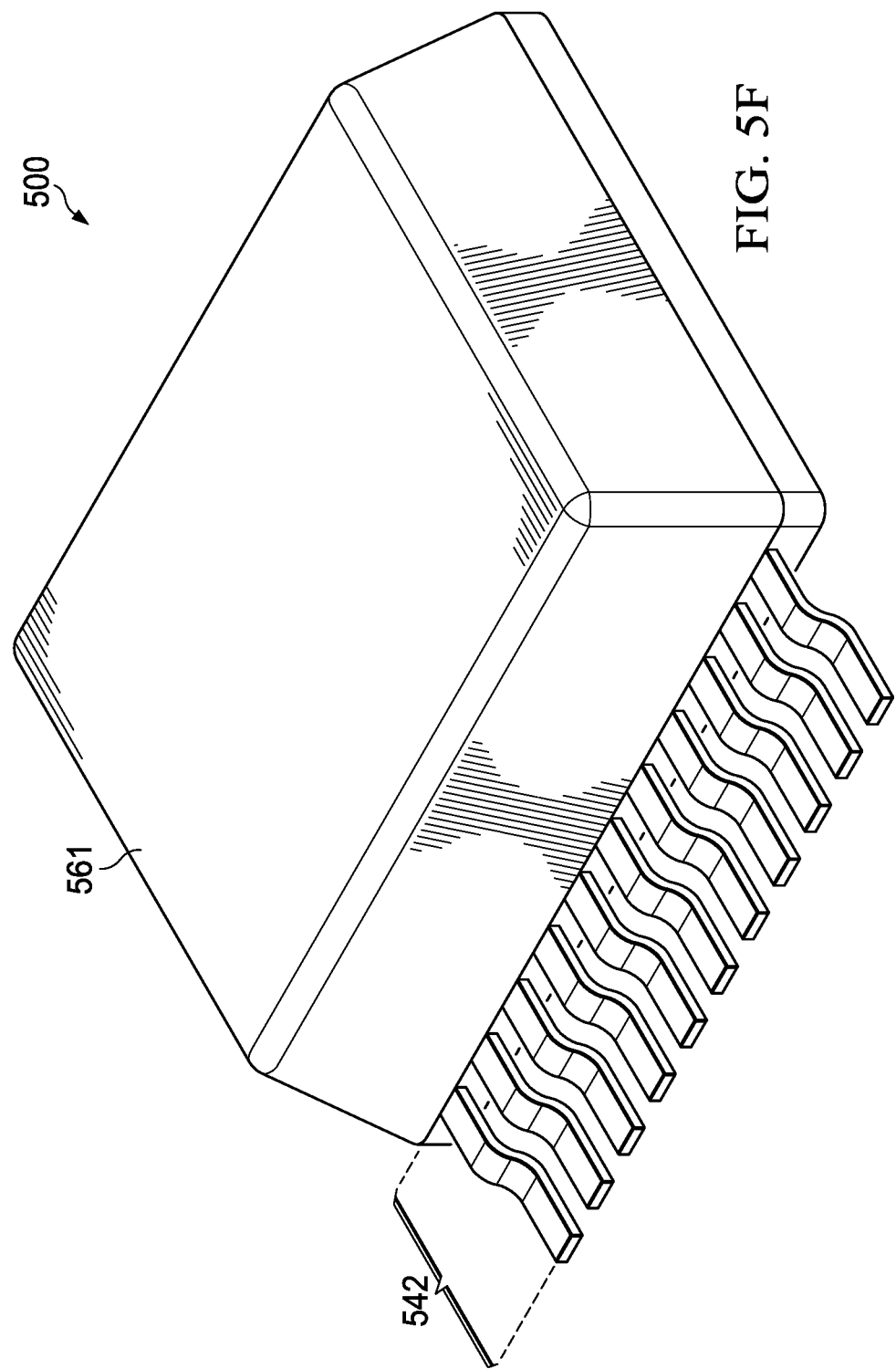

FIG. 5F shows in a projection view a completed SIP package device 500 formed using the method of FIG. 4 following a trim and form step that completes the package. The SIP device 500 includes the package body 561 and leads 542. As shown in FIG. 5F, the leads 542 are now separated one from another by mechanical trimming and are formed to allow for electrical connection and physical attachment to a circuit board. In the example of FIG. 5F, the leads 542 are arranged on one side of the SIP device 500, in other examples, leads can extend from two or more sides of the SIP device.

In the arrangements, the assembly of the inductor and the leadframes is made so that the portion of the body of the inductor that is closest to the leadframes is spaced from the surface of the closest leadframe by a minimum distance. FIGS. 6A-6C show in a side, bottom and end view one example of an inductor for use with the arrangements.

FIG. 6A is a side view of an inductor 605. In FIG. 6A, the inductor has a body 607 and a conductive electrical terminal 609. As shown in portion 601, the exterior surface 615 of the electrical terminal 609 extends beyond the exterior surface of the body 607. As is further shown hereinbelow, a standoff is created to space the exterior portion of the body 607 from the exterior surface 615 of the terminal 609.

FIG. 6B is a bottom view of the inductor 605 looking at the terminals and the bottom of the body 604. Terminals 609, 611 wrap around the body 604 to form mounting surfaces for surface mount on one surface of the inductor 605, the bottom surface as the inductor is oriented in FIG. 6A. The terminals in this example only extend over a portion of the body, but in another example can extend along the entire inductor body.

FIG. 6C is an end view of inductor 605. Terminals 609, 611 are shown extending from a middle portion of the sides of body 604 and following the contour of body 604 to extend around body 604 to form surfaces for surface mounting at the bottom of inductor 605 (as oriented in FIG. 6C.) A standoff 608 is formed to space the exterior surface of body 604 from the exterior surface 615 of the terminal 609. When inductor 605 is mounted on a surface using the exterior surface 615 of terminals 609, 611, the standoff 608 spaces a portion 612 of the body 604 of the inductor 605 from the surface of the leadframe (not shown in FIG. 6C) that the inductor 605 is mounted to, as described hereinabove. This gap 608 also fills with molding compound during the molding process, which places an insulator material between the body of the inductor 605 and the leadframe surface, preventing the electric field from forming and thus preventing damage to the inductor as described hereinabove. Comparing the cross section of FIG. 1 to the end view of the inductor of the arrangement in FIG. 6C, the standoff 608 can clearly be seen in the inductor 605.

Figure 7:
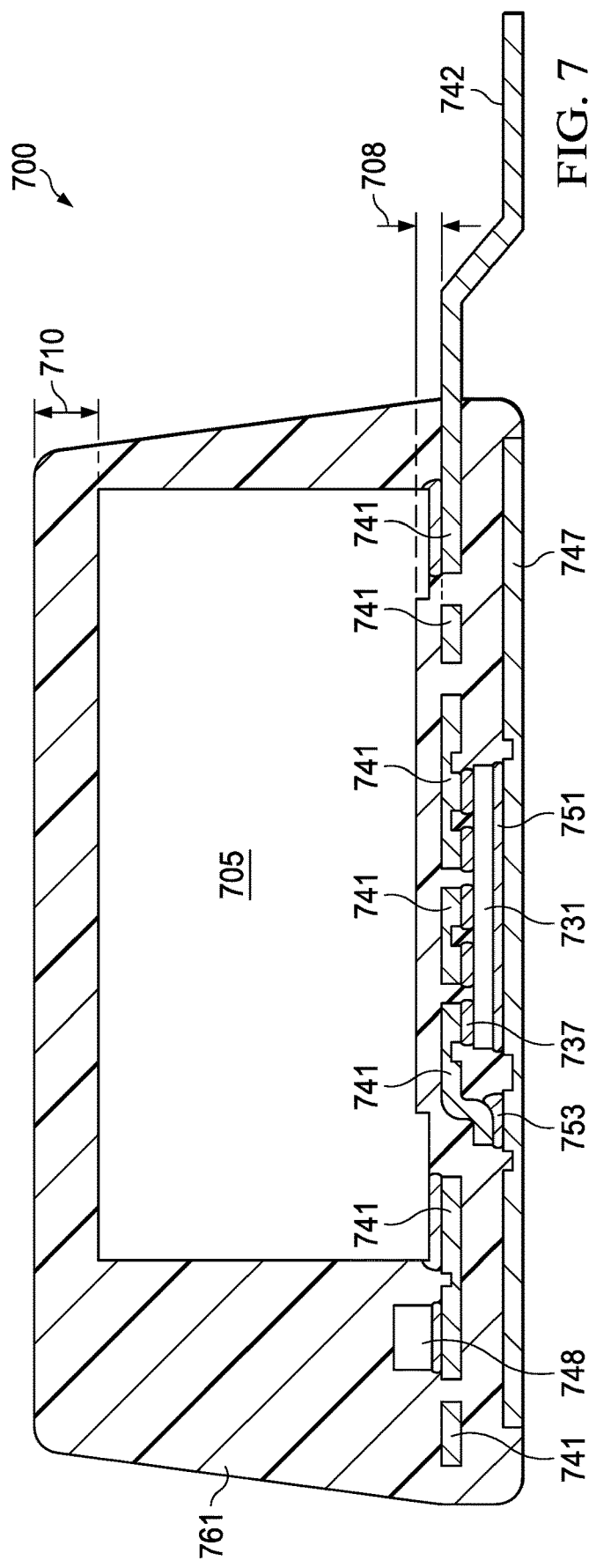
FIG. 7 is a cross section of an example SIP arrangement with an inductor.

FIG. 7 is a cross section of an arrangement for an SIP device 700 including an inductor 705 such as shown in FIGS. 6A-6C and including a gap 708 between the inductor body and the nearest leadframe portion. The arrangement of FIG. 7 can be assembled using the method of FIG. 4. In FIG. 7, the reference labels used for elements similar to those shown in FIG. 3 are similar, for clarity of explanation. For example, inductor 705 corresponds to inductor 305 in FIG. 3.

In FIG. 7, the inductor 705 includes a standoff as shown in FIG. 6C so that a gap 708 of at least 100 μms, and in some examples, up to 200 μms, is formed between the exterior of the body of inductor 705 and the first leadframe 741. The SIP body 761 is formed by a molding operation as described hereinabove and the mold compound fills the gap 708 so that insulating mold compound is between the inductor body 705 and the first leadframe 741, preventing the electric field from forming between the inductor and the leadframe. The cross section of FIG. 7 also shows the passive component 748, the integrated circuit die 731, the solder bumps 737, and solder paste die attach 751 between the integrated circuit die 731 surface opposite the solder bumps 737 and solder paste 753 between a lead extending from the second surface of leadframe 741 and the first surface of the second leadframe 747. A portion of the first leadframe 741 extends and forms leads 742 outside of the package body 761.

The arrangement of FIG. 7 allows the use of the existing leadframe designs for leadframe 741 and 747 with the inductor 705 and the standoff described hereinabove to form gap 708. The shape of inductor 705 does reduce the distance 710 between the uppermost surface of the inductor 705 and the top of the molded package 761 by the gap distance 708, so that the height of the body 761 remains the same as for SIP devices made without the gap of the arrangements and missing the gap 708. The distance 710 is reduced slightly by use of the inductor of the arrangements, but the package body 761 still covers and protects the inductor 705.

In the example arrangement described hereinabove, the gap 708 is created by ensuring the inductor 705 includes a standoff as shown in FIG. 6C between the exterior surface of the terminals of inductor 705 and the inductor body. This arrangement is shown in FIG. 6C in detail. In alternative example arrangements, the gap 708 can be created by adding conductive spacers to the first surface of first leadframe 741 in the areas where the inductor 705 has its terminals attached to the leadframe 741. In another alternative example, the inductor 705 can have spacers added to the terminal surfaces prior to assembly of the SIP package elements. Each of these alternatives will provide the gap of the arrangements, however, each of these approaches is less desirable than forming the inductor 705 with the standoff distance shown in FIG. 6C. The use of the standoff in FIG. 6C to provide the gap 708 in the assembled SIP package achieves advantages and also avoids the need to modify or add material to the leadframe 741 or to add material to the inductor terminals, and provides a robust and cost effective solution without the need for redesign or retooling of the SIP package.

Various modifications and combinations of the arrangements, as well as other alternative arrangements, are apparent upon reference to the description. As an example, in semiconductor technology, the arrangements apply not only to devices using solder paste as a connecting agent, but also to devices using conductive adhesive.

Modifications are possible in the described arrangements, and other additional arrangements are possible, within the scope of the claims.

What is claimed is:

1. A semiconductor device comprising:
a first metal portion and a second metal portion;
an integrated circuit die between the first metal portion and the second metal portion;
an inductor attached to the first metal portion via a conductive material, wherein the inductor includes terminals and a body portion, a bottom surface of the terminals extending beyond a plane along a bottom surface of the body portion such that there is a gap between the plane along the bottom surface of the body portion and the first metal portion.

2. The semiconductor device of claim 1, wherein the gap is at least 100 μm.

3. The semiconductor device of claim 1, wherein a height of the gap is equal to a height of the terminals and a height of the conductive material.

4. The semiconductor device of claim 1, wherein the conductive material is solder.

5. The semiconductor device of claim 1 and further comprising mold compound covering portions of the inductor, the first metal portion, the integrated circuit die, and the second metal portion.

6. The semiconductor device of claim 1, wherein the inductor is a ferrite body inductor.

7. The semiconductor device of claim 1, wherein the integrated circuit die includes a side with terminals facing the bottom surface of the inductor.

8. The semiconductor device of claim 1, wherein the integrated circuit die is aligned between the terminals of the inductor from a side view of the semiconductor device.

9. The semiconductor device of claim 1, wherein the second metal portion is exposed from the semiconductor device.

10. The semiconductor device of claim 1, and further comprising a passive component attached to the first metal portion.

11. The semiconductor device of claim 1, wherein the first metal portion protrudes from the semiconductor device forming leads of the semiconductor device.

12. The semiconductor device of claim 1, wherein a bottom surface of the leads is coplanar with a bottom surface of the second metal frame.

13. The semiconductor device of claim 1, wherein the first metal portion and the second metal portion are of a same metal and include copper.

14. A system in package (SIP) device, comprising:
a first metal portion and a second metal portion;
an integrated circuit die between the first metal portion and the second metal portion;
an inductor attached to the first metal portion via a conductive material, wherein the inductor includes a terminal and a body portion, a portion of the terminal extending beyond a plane along a bottom surface of the body portion such that there is a gap between the plane along the bottom surface of the body portion and a surface of the first metal portion.

15. The SIP device of claim 14, wherein the gap is at least 100 μm.

16. The SIP device of claim 14, wherein the gap is between 100 μm and 200 μm.

17. The SIP device of claim 14, wherein a height of the gap is equal to a height of the terminals and a height of the conductive material.

18. The SIP device of claim 14 and further comprising mold compound covering portions of the inductor, the first metal portion, the integrated circuit die, and the second metal portion.

19. The SIP device of claim 14 and further comprising a passive component attached to the first metal portion.

20. The semiconductor device of claim 14, wherein the first metal portion and the second metal portion are of a same metal and include copper.

* * * * *